(12) United States Patent
Yim

(10) Patent No.: US 7,323,413 B2
(45) Date of Patent: Jan. 29, 2008

(54) METHOD FOR STRIPPING SILICON NITRIDE

(75) Inventor: Teresa Yim, Bukjeju-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 134 days.

(21) Appl. No.: 11/225,203

(22) Filed: Sep. 14, 2005

(65) Prior Publication Data

US 2006/0057849 A1    Mar. 16, 2006

(30) Foreign Application Priority Data

Sep. 14, 2004    (KR) .................. 10-2004-0073332

(51) Int. Cl.
*H01L 21/302* (2006.01)
(52) U.S. Cl. .................. 438/689; 438/691; 438/745; 438/757
(58) Field of Classification Search ............. 438/689, 438/691, 745, 757
See application file for complete search history.

(56) References Cited

U.S. PATENT DOCUMENTS

2003/0075272 A1*   4/2003   Ottow et al. ........... 156/345.15

* cited by examiner

*Primary Examiner*—Hsien-Ming Lee
(74) *Attorney, Agent, or Firm*—McKenna Long & Aldridge LLP

(57) ABSTRACT

An apparatus and a method for stripping silicon nitride are disclosed that facilitate automatic, real-time, and exact measurement of etch rate and an ending time of the etching process when silicon nitride is stripped with phosphoric acid solution. The method for stripping silicon nitride includes the steps of: a) measuring initial concentration of a specific ion in a phosphoric acid solution contained in a reactor, b) dipping a silicon nitride-formed substrate into the phosphoric acid solution in the reactor, c) measuring instantaneous concentration of the specific ion in stripping solution extracted from the reactor when silicon nitride stripping is processed in the reactor, and d) finishing the silicon nitride stripping process if variation rate of the measured instantaneous concentration is not exceeding a predetermined standard, or returning to the step c) if the variation rate is more than the predetermined standard.

3 Claims, 4 Drawing Sheets

METHOD FOR STRIPPING SILICON NITRIDE

CROSS-REFERENCE TO RELATED APPLICATIONS

This application claims the benefit of Korean Application No. P2004-73332, filed on Sep. 14, 2004, which is incorporated herein by reference in its entirety.

BACKGROUND OF THE INVENTION

1. Field of the Invention

The present invention relates to an apparatus and a method for stripping silicon nitride, and more particularly, to an apparatus and a method for stripping silicon nitride that facilitate automatic, real-time, and exact measurement of etch rate and an ending time of the etching process when silicon nitride is stripped with phosphoric acid solution.

2. Discussion of the Related Art

IC has devices including transistors and diodes formed on a semiconductor substrate, and metal lines connecting the devices with each other. An insulating layer is formed for various purposes, e.g., to insulate between the metal lines and to improve the characteristics of the devices.

The insulating layer includes silicon oxide ($SiO_2$), doped silicon oxide, and silicon nitride such as SiN and $Si_3N_4$.

The silicon nitride is used as an insulating layer for a capacitor device, a passivation layer for preventing diffusion of moisture and sodium, a mask for selective etching since the silicon nitride is not oxidized and thus prevents a silicon oxide layer thereunder from being oxidized, and an etch stop layer for a silicon oxide layer thereon or thereunder.

After deposited, the silicon nitride is patterned or stripped for a certain purpose. The patterning or stripping process is usually performed using wet etch method with ortho-phosphoric acid ($H_3PO_4$).

The chemical reaction during the wet etch process is represented by the chemical equation (1) as follows:

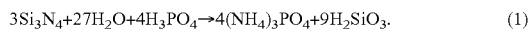
$$3Si_3N_4 + 27H_2O + 4H_3PO_4 \rightarrow 4(NH_4)_3PO_4 + 9H_2SiO_3. \quad (1)$$

As shown in the chemical equation (1), phosphoric acid and water are consumed during the stripping process of a silicon nitride. The phosphoric acid in the phosphoric acid solution is dehydrated, the chemical equations of which are as follow:

$$2H_3PO_4 \rightarrow H_4P_2O_7 + H_2O \quad (2)$$

$$H_4P_2O_7 \rightarrow 2HPO_3 + H_2O \quad (3)$$

$$2HPO_3 \rightarrow P_2O_5 + H_2O \quad (4)$$

The phosphoric acid ($H_3PO_4$) produces phosphorus pentoxide ($P_2O_5$) through the dehydration reaction of chemical equation (2) through (4), during which pyro-phosphoric acid ($H_4P_2O_7$) and meta-phosphoric acid ($HPO_3$) are formed respectively as an intermediate.

Through the dehydration reaction, the concentration of water and phosphoric acid decreases and the etch rate of silicon nitride reduces. Meanwhile, it is usual to keep adding water since more water is consumed than phosphoric acid while silicon nitride is stripped.

Continuous supply of water, however, may cause re-hydration reaction, and thus, variation of etch rate of silicon nitride. The variation of etch rate makes it hard to know the thickness of the silicon nitride etched and to find out the time when the etching process should be stopped. Furthermore, if too much water is added, there may occur problems, e.g., the etch rate is highly reduced. Thus, a method has been required that facilitates automatic, real-time, and exact measurement of etch rate and an ending time of the etching process when silicon nitride is stripped.

U.S. Pat. No. 4,092,211 by Morris discloses a method for controlling etch rate of silicon oxide by adding silicate materials to a phosphoric acid solution when silicon oxide used for masking silicon nitride is selectively removed with the phosphoric acid solution. U.S. Pat. No. 5,938,885 by Huang et al. discloses a method for continuously monitoring etch rate of silicon nitride with hydrometer and supplying water or heat to control the etch rate when the silicon nitride is etched with phosphoric acid solution.

The method disclosed by Huang et al., however, is not a method for quantitatively measuring the etch rate of the silicon nitride but merely a method for supplying water or heat which is reduced during the etching process of the silicon nitride.

SUMMARY OF THE INVENTION

Accordingly, the present invention is directed to an apparatus and a method for stripping silicon nitride that substantially obviate one or more problems due to limitations and disadvantages of the related art.

An object of the present invention is to provide an apparatus and a method for stripping silicon nitride that facilitate automatic, real-time, and exact measurement of etch rate and an ending time of the etching process when silicon nitride is stripped with phosphoric acid solution.

Additional advantages, objects, and features of the invention will be set forth at least in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, a method for stripping silicon nitride may include the steps of: a) measuring initial concentration of a specific ion in a phosphoric acid solution contained in a reactor, b) dipping a silicon nitride-formed substrate into the phosphoric acid solution in the reactor, c) measuring instantaneous concentration of the specific ion in stripping solution extracted from the reactor when silicon nitride stripping is processed in the reactor, and d) finishing the silicon nitride stripping process if variation rate of the measured instantaneous concentration is not exceeding a predetermined standard, or returning to the step c) if the variation rate is more than the predetermined standard.

The specific ion may be $SiO_3^{2-}$ or $NH_4^+$. The instantaneous concentration of $SiO_3^{2-}$ may be obtained by measuring the bonding energy between silicon and oxygen. The instantaneous concentration of $NH_4^+$ may be obtained by measuring the bonding energy between nitrogen and hydrogen.

The predetermined standard to be compared with the variation rate of the measured instantaneous concentration may be 0.

In another aspect, an apparatus for stripping silicon nitride may include a extractor for extracting stripping solution from a reactor in which a silicon nitride-formed substrate is dipped, a measuring cell on which the extracted stripping solution is put, a light source for emitting light to the extracted stripping solution on the measuring cell, a detector for measuring concentration of a specific ion in the extracted stripping solution using a light transmitted or reflected by the measuring cell.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
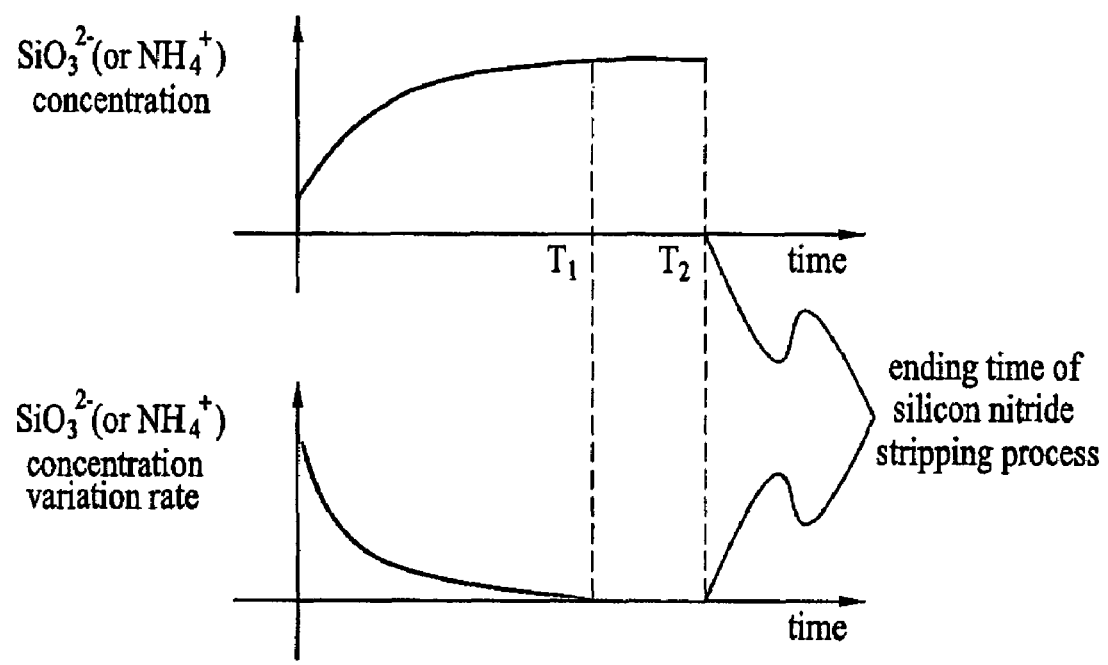
FIG. 1 is a graph for illustrating concentration variation of $SiO_3^{2-}$ or $NH_4^+$ during silicon nitride stripping process.

FIG. 1 is a graph for illustrating concentration and concentration variation rate (Y-axis) of $SiO_3^{2-}$ or $NH_4^+$ according to time (X-axis) passage when silicon nitride is stripped with phosphoric acid solution.

Referring to the chemical equation (1) and FIG. 1, while the concentration of $SiO_3^{2-}$ or $NH_4^+$ increases as the silicon nitride stripping process is proceeded, the concentration variation rate decreases as the amount of etched silicon nitride increases. Accordingly, it is possible to ascertain whether the silicon nitride is completely stripped by measuring the concentration of $SiO_3^{2-}$ or $NH_4^+$ continuously or every predetermined intervals. Namely, if there is little difference between concentrations of $SiO_3^{2-}$ or $NH_4^+$ at the time of T1 and T2, the silicon nitride stripping process may be finished at the time of T2. It also may possible to measure the concentration of an ion other than $SiO_3^{2-}$ or $NH_4^+$ that may be produced during the silicon nitride stripping process.

Figure 2:
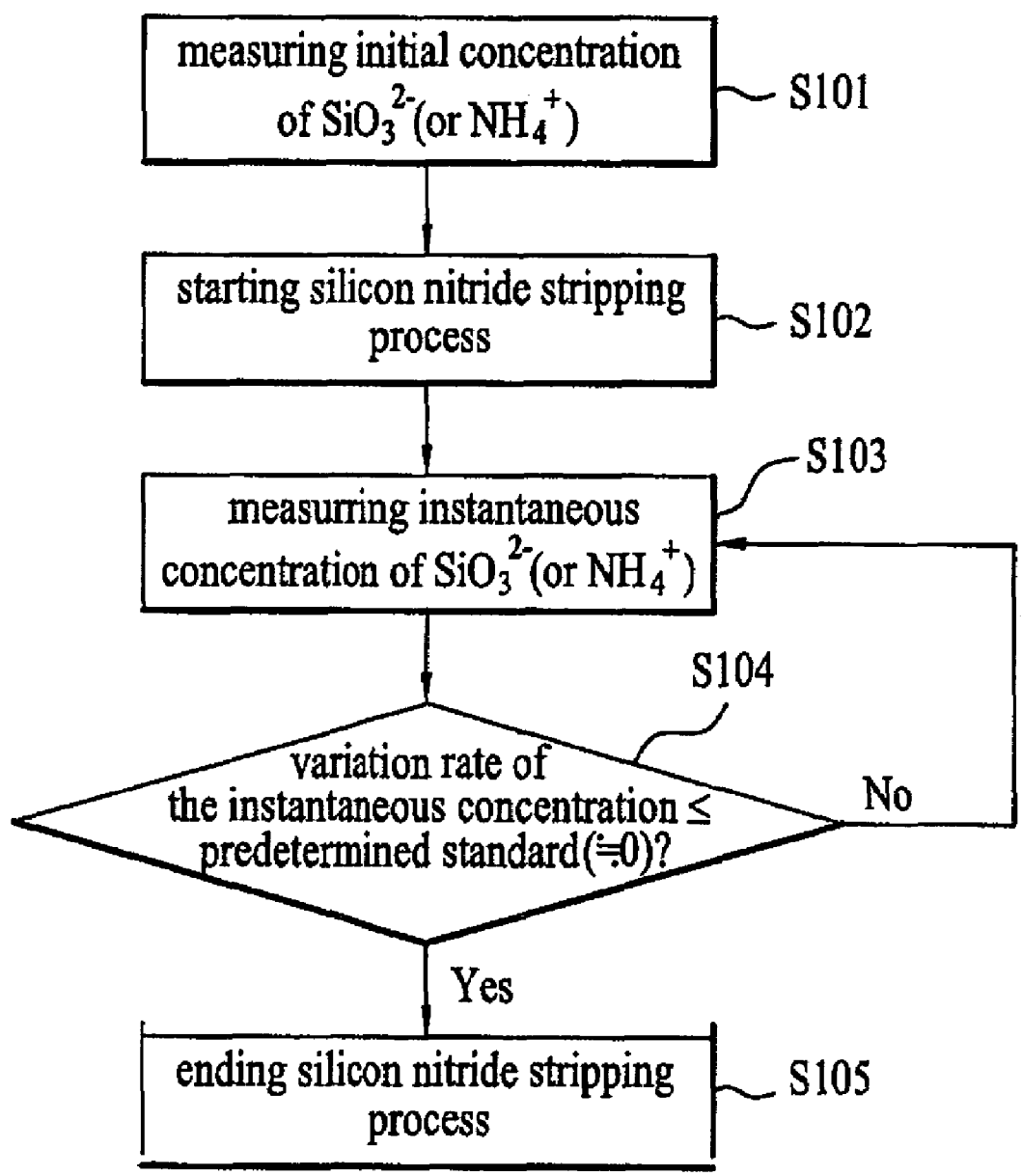
FIG. 2 is a flow-chart of an exemplary process for stripping silicon nitride according to the present invention.

FIG. 2 is a flowchart of an exemplary process for stripping silicon nitride according to the present invention.

Referring to FIG. 2, the initial concentration of $SiO_3^{2-}$ or $NH_4^+$ in phosphoric acid solution is measured and saved as a first step S101.

After the measurement of the initial concentration, the phosphoric acid solution may be replaced by another one or be added to with water. And then, a silicon nitride-formed substrate is dipped in a reactor containing the phosphoric acid solution S102.

Subsequently, a certain amount of the phosphoric acid solution is extracted from the reactor, and the instantaneous concentration of $SiO_3^{2-}$ or $NH_4^+$ in the extracted phosphoric acid solution is measured S103. The amount of the extracted phosphoric acid solution is preferably small. The instantaneous concentration of $SiO_3^{2-}$ or $NH_4^+$ is measured using a light that is incident on the solution and then transmitted or reflected. Namely, a principle is used that when light is incident on a compound, the compound absorbs the light having a specific wavelength corresponding to its own chemical structure with an amount in proportion to its concentration. Specifically, the concentrations of $SiO_3^{2-}$ and $NH_4^+$ may be obtained by measuring specific energies related to the chemical bonding between silicon-oxygen (Si—O) and nitrogen-hydrogen (N—H) respectively. Such principle is similar with that used in UV-Vis spectrophotometer.

And then, variation rate of the measured instantaneous concentration is calculated and the calculated variation rate is compared with a predetermined standard S104. If the variation rate of the instantaneous concentration is more than the predetermined standard, the silicon nitride stripping process is continued. On the contrary, if the variation rate is not exceeding the predetermined standard, the stripping process is finished. Optionally, for overetch, the stripping process may be continued for a certain time after the variation rate becomes below the predetermined standard. Preferably, the predetermined standard is set as 0 or approximately O.

Figure 3:
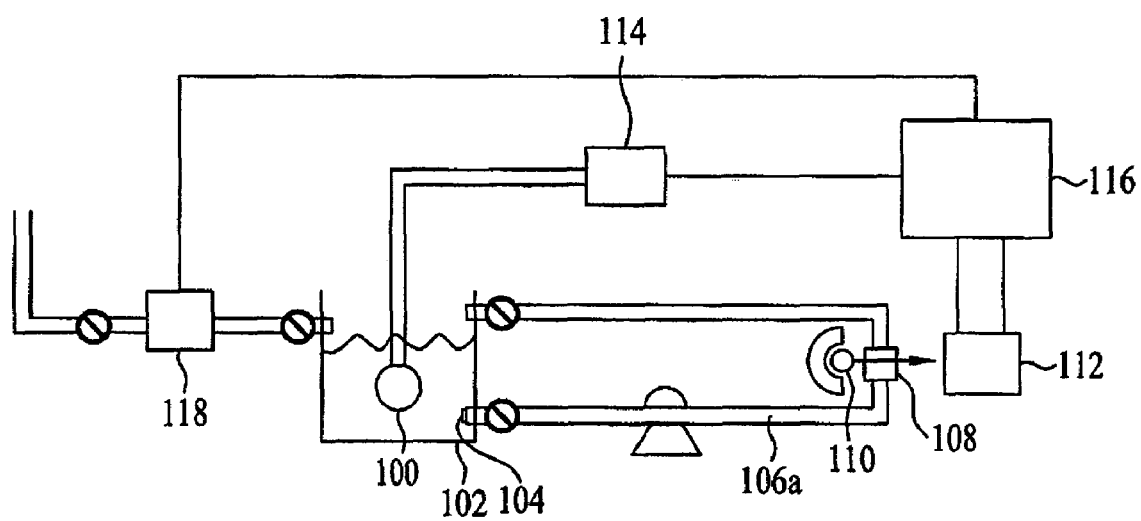
FIG. 3 is a structural view of an exemplary apparatus for stripping silicon nitride according to the present invention.

FIG. 3 is a structural view of an exemplary apparatus for stripping silicon nitride according to the present invention.

Referring to FIG. 3, a silicon nitride-formed semiconductor substrate 100 is dipped into phosphoric acid solution contained in a reactor 102. A measurement sample of the phosphoric acid solution is extracted from the reactor 102 by an extractor 104. The extracted phosphoric acid solution is carried to a measurement cell 108 through an extracting tube 106a. The measurement sample is extracted continuously or every predetermined intervals. The extraction of the sample does not affect the silicon nitride stripping process since the extraction amount necessary for the concentration measurement is at most tens of mL at a time.

After measured on the measurement cell 108, the sample solution flows into the reactor 102 through an influx tube 106b or is drained.

A light source 110 emits light, e.g., UV or visible light, is incident on the phosphoric acid solution on the measurement cell 108. A detector 112 measures the concentration of a specific ion by using the light transmitted or reflected by the phosphoric acid solution on the measurement cell 108.

The measurement data from the detector 112 is saved and computed at a computer system 116, and then transmitted to a controller 114. After receiving the computed measurement data, the controller 114 makes a substrate carrier (not shown) move in such a way that the substrate 100 comes out of the phosphoric acid solution. The controller 114 may or may not be a part of the apparatus of the present invention.

A water/$H_3PO_4$ supplier may be connected to the reactor 102 to supply water or phosphoric acid solution under the control of the computer system 116 while the stripping process is ongoing or after it is completed.

Figure 4A:
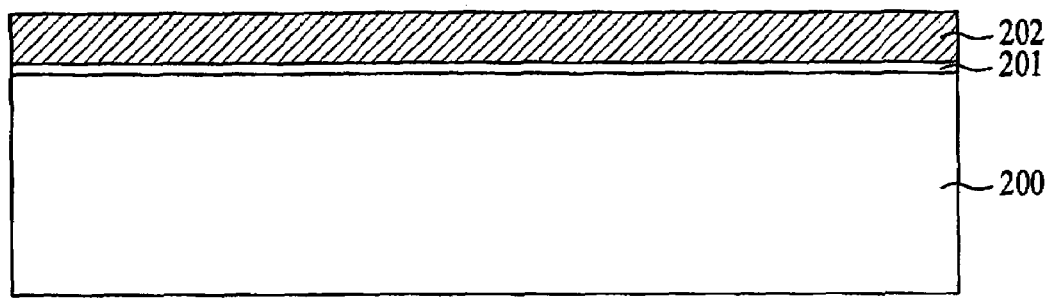
FIG. 4A to FIG. 4B are cross sectional views of illustrating the process for stripping silicon nitride according to an application of the present invention.
Figure 4B:
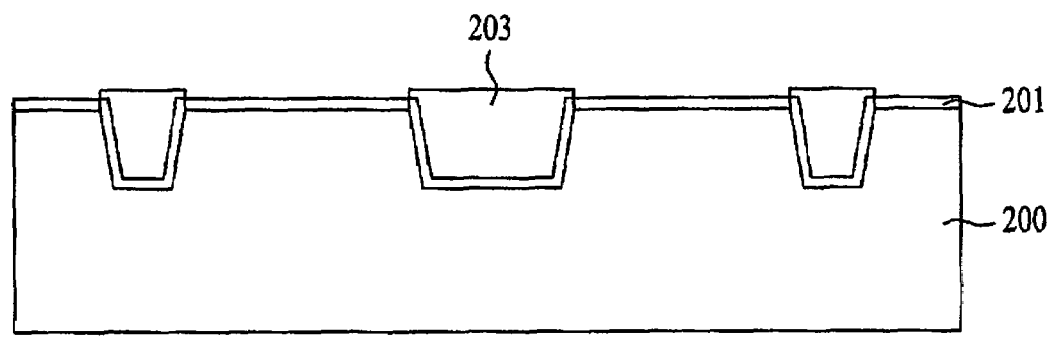

FIG. 4A to FIG. 4B are cross sectional views of illustrating the process for stripping silicon nitride according to an application of the present invention.

Referring to FIG. 4A, an oxide layer 201 and a silicon nitride layer 202 are formed on a semiconductor substrate 200.

Referring to FIG. 4B, STI (Shallow Trench Isolation) 203 is formed for the insulation between transistors to be formed, and then, the silicon nitride layer 202 is removed. Subsequently, ion implantation is performed to form wells in the substrate 200 to make N-MOS(N-channel Metal Oxide Semiconductor) or P-MOS (P-channel Metal Oxide Semiconductor). Usually, a silicon oxide layer is formed through oxidation process to prevent damages that may occur on the substrate when the ion implantation is performed. However, since the oxidation process is performed at high temperature, it may cause movement of previously doped ions and adversely affect the characteristics of the device. In the case of a CMOS image sensor, for example, specific ions are doped in STI area to remove dangling bond of silicon in the STI area that may cause leakage current. The doped ions, however, may be a source of leakage current since movement of the doped ions may occur during the oxidation process may be cause the leakage current.

Accordingly, the oxide layer 201 under the silicon nitride layer 202 may be used as a barrier film when the ion implantation is performed. In this regard, the thickness of the oxide layer 201 should be managed to be uniform in every each cases. Otherwise, the characteristics of a device may change after the ion implantation process.

To make the thickness of the oxide layer 201 uniform in every each cases, the apparatus and method for stripping silicon nitride according to the present invention may be applied. That is, the thickness of the oxide layer 201 may be managed to be uniform since the exact ending time of the silicon nitride stripping process may be caught according to the present invention.

The application of the present invention mentioned above is only an example among the various semiconductor device fabricating processes where a silicon nitride layer is deposited and etched and thus the present invention may be applied. Among the processes are processes for fabricating a memory device such as DRAM, SRAM and Flesh memory, a sensor such as CMOS sensor, CCD sensor and infrared sensor, a display device such as LCD, PDP and LED, and ASICs.

As mentioned above, the apparatus and method for stripping silicon nitride according to the present invention has advantages in that automatic, real-time, and exact measurement of etch rate and an ending time of the etching process when silicon nitride is stripped with phosphoric acid solution can be accomplished, and thus, accurate process control can be made and unnecessary oxide layers can be prevented from forming.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for stripping silicon nitride comprising the steps of:
   a) measuring initial concentration of a specific ion in a phosphoric acid solution contained in a reactor;
   b) dipping a silicon nitride-formed substrate into the phosphoric acid solution in the reactor;
   c) measuring instantaneous concentration of the specific ion in stripping solution extracted from the reactor when silicon nitride stripping is processed in the reactor; and
   d) finishing the silicon nitride stripping process if variation rate of the measured instantaneous concentration is not exceeding a predetermined standard, or returning to the step c) if the variation rate is more than the predetermined standard, wherein the specific ion is $SiO_3^{2-}$ or $NH_4^+$.

2. The method of claim 1, wherein the instantaneous concentration of $SiO_3^{2-}$ is obtained by measuring bonding energy between silicon and oxygen, and the instantaneous concentration of $NH_4^+$ may be obtained by measuring bonding energy between nitrogen and hydrogen.

3. The method of claim 1, wherein the predetermined standard to be compared with the variation rate of the measured instantaneous concentration is 0.

* * * * *